United States Patent
Ji et al.

(10) Patent No.: US 10,204,739 B1
(45) Date of Patent: Feb. 12, 2019

(54) MULTILAYER ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Gu Won Ji, Suwon-si (KR); Heung Kil Park, Suwon-si (KR); Se Hun Park, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/850,933

(22) Filed: Dec. 21, 2017

(30) Foreign Application Priority Data

Sep. 27, 2017 (KR) .......................... 10-2017-0125463

(51) Int. Cl.
| | |
|---|---|
| *H01G 4/248* | (2006.01) |
| *H05K 1/18* | (2006.01) |
| *H01G 4/30* | (2006.01) |
| *H05K 1/11* | (2006.01) |

(52) U.S. Cl.
CPC .............. *H01G 4/248* (2013.01); *H01G 4/30* (2013.01); *H05K 1/111* (2013.01); *H05K 1/181* (2013.01); *H05K 2201/10015* (2013.01)

(58) Field of Classification Search
CPC . H05K 2201/10568; H05K 2201/2036; H05K 2201/10636; H05K 1/111; H05K 1/181; H05K 2201/10015; H01G 2/065; H01G 2/06; H01G 4/248; H01G 4/30
See application file for complete search history.

(56) References Cited

U.S. PATENT DOCUMENTS

| | | | | |
|---|---|---|---|---|
| 2013/0050893 | A1* | 2/2013 | Kim | H01G 4/228 361/306.3 |
| 2014/0016242 | A1 | 1/2014 | Hattori et al. | |
| 2014/0124251 | A1* | 5/2014 | Park | H05K 3/3442 174/257 |
| 2015/0096792 | A1* | 4/2015 | Ogawa | H01G 2/06 174/255 |

(Continued)

FOREIGN PATENT DOCUMENTS

| | | |
|---|---|---|
| JP | 2012-204572 A | 10/2012 |
| KR | 10-2015-0051668 A | 5/2015 |

*Primary Examiner* — Steven T Sawyer
(74) *Attorney, Agent, or Firm* — McDermott Will & Emery LLP (57) ABSTRACT

A multilayer electronic component includes a capacitor body, first and second external electrodes, first and second land portions, and first and second insulating portions. The first and second external electrodes are disposed and spaced apart from each other on a mounting surface of the capacitor body. The first and second land portions include a conductive material and are disposed on the first and second external electrodes, respectively. The first and second insulating portions are disposed between the first and second land portions on the mounting surface of the capacitor body to be spaced apart from each other and each have one end connected to a respective one of the first and second land portions. A board having a multilayer electronic component includes a circuit board having first and second electrode pads disposed on one surface thereof, and the multilayer electronic component mounted thereon.

16 Claims, 4 Drawing Sheets

(56) References Cited

U.S. PATENT DOCUMENTS

| | | | |
|---|---|---|---|
| 2015/0122534 A1 | 5/2015 | Park et al. | |
| 2015/0270068 A1* | 9/2015 | Hattori | H01G 4/30 361/301.4 |
| 2016/0093441 A1* | 3/2016 | Ahn | H01G 4/232 174/260 |
| 2016/0217926 A1* | 7/2016 | Jun | H01G 4/228 |

* cited by examiner

MULTILAYER ELECTRONIC COMPONENT AND BOARD HAVING THE SAME

CROSS-REFERENCE TO RELATED APPLICATION(S)

This application claims benefit of priority to Korean Patent Application No. 10-2017-0125463 filed on Sep. 27, 2017 in the Korean Intellectual Property Office, the disclosure of which is incorporated herein by reference in its entirety.

BACKGROUND

1. Field

The present disclosure relates to a multilayer electronic component and a board having the same.

2. Description of Related Art

A multilayer capacitor, a type of multilayer electronic component, is formed of a dielectric material, and such a dielectric material may have piezoelectric properties that may cause deformation of the dielectric material in synchronization with a voltage applied thereto.

When a period of the applied voltage is within an audio frequency band, displacement of the dielectric material causes vibrations which may be transferred to a circuit board through solders, and the vibrations of the circuit board may in turn be heard as sound. Such sound is known as acoustic noise.

In a case in which a device is operated in a silent environment, a user may recognize the acoustic noise as abnormal noise and may believe that a fault has occurred in the device.

In addition, in a device having an audio circuit, acoustic noise may overlap an audio output, such that quality of the signal output from the device may be deteriorated.

In addition, in a case in which piezoelectric vibrations of the multilayer capacitor are generated in a high frequency region of 20 kHz or more, the vibrations may cause malfunctions other than those related to the acoustic noise experienced by a user. For example, malfunctions of various sensors used in information technology (IT) and industrial/electrical component fields may be caused.

Meanwhile, external electrodes of the multilayer capacitor and the circuit board are connected to each other by solders. In this case, the solders may be formed in an inclined state at a predetermined height along surfaces of the external electrodes on opposite side surfaces or opposite end surfaces of a capacitor body.

Here, as a volume and a height of the solders are increased, the vibrations of the multilayer capacitor are more easily transferred to the circuit board, such that a magnitude of the generated acoustic noise is increased.

SUMMARY

An aspect of the present disclosure may provide a multilayer electronic component of which acoustic noise in an audio frequency region less than 20 kHz and high frequency vibrations in a high frequency region of 20 kHz or more may be reduced, and a board having the same.

According to an aspect of the present disclosure, a multilayer electronic component may include a capacitor body, first and second external electrodes, first and second land portions, and first and second insulating portions. The first and second external electrodes are disposed and spaced apart from each other on a mounting surface of the capacitor body. The first and second land portions include a conductive material and are disposed on the first and second external electrodes, respectively. The first and second insulating portions are disposed between the first and second land portions on the mounting surface of the capacitor body to be spaced apart from each other and each have one end connected to a respective one of the first and second land portions.

The capacitor body may have a first surface corresponding to the mounting surface, a second surface opposing the first surface, and third and fourth surfaces connected to the first and second surfaces and opposing each other. The capacitor body may include first and second internal electrodes each having one end exposed through a respective one of the third and fourth surfaces. The first and second external electrodes may include, respectively, first and second band portions disposed on the first surface to be spaced apart from each other and respectively connected to the first and second land portions, and first and second connected portions each extended from a respective one of the first and second band portions to a respective one of the third and fourth surfaces and respectively connected to the first and second internal electrodes.

Widths and lengths of the first and second land portions may be smaller than those of the first and second band portions, respectively.

First and second solder accommodating portions may be provided on the first and second band portions, respectively, by steps between the first band and first land portions and between the second band and second land portions.

Widths of the first and second insulating portions may be narrower than that of the capacitor body.

The capacitor body may have fifth and sixth surfaces connected to the first and second surfaces, connected to the third and fourth surfaces, and opposing each other. The first external electrode may extend to portions of the second, fifth, and sixth surfaces of the capacitor body. The second external electrode may extend to portions of the second, fifth, and sixth surfaces of the capacitor body.

The first and second land portions may be conductive patterns disposed on a surface of the capacitor body formed of ceramic.

The first and second insulating portions may be formed of epoxy or insulating ceramic.

According to another aspect of the present disclosure, a board having a multilayer electronic component may include a circuit board having first and second electrode pads disposed on one surface thereof, and the multilayer electronic component as described above mounted on the circuit board so that the first and second land portions are connected to the first and second electrode pads, respectively.

According to a further aspect of the present disclosure, a multilayer electronic component may include a capacitor body, first and second external electrodes disposed on a mounting surface of the capacitor body, and first and second insulating portions spaced apart from each other between the first and second external electrodes on the mounting surface of the capacitor body.

The first and second insulating portions may respectively contact the first and second external electrodes, and a portion of the mounting surface of the capacitor body may be exposed between the first and second insulating portions.

The multilayer electronic component may further include first and second land portions formed of conductive material and respectively disposed on the first and second external electrodes. The first and second land portions may respectively contact the first and second insulating portions.

The first and second insulating portions may have a greater thickness, measured orthogonally to the mounting surface of the capacitor body, than the first and second external electrodes, and the first and second land portions may have a greater thickness, measured orthogonally to the mounting surface of the capacitor body, than the first and second insulating portions.

The first and second land portions may be spaced apart from outer edges of the mounting surface of the capacitor body.

According to another aspect of the disclosure, a multilayer electronic component may include a capacitor body, first and second external electrodes disposed on a mounting surface of the capacitor body, and first and second land portions formed of conductive material and respectively disposed on the first and second external electrodes. The first and second land portions may be spaced apart from outer edges of the mounting surface of the capacitor body.

The first and second land portions may have a greater thickness, measured orthogonally to the mounting surface of the capacitor body, than the first and second external electrodes.

The first and second external electrodes may be spaced apart from each other on the mounting surface of the capacitor body, the first land portion may be aligned with an edge of the first external electrode facing the second external electrode, and the second land portion may be aligned with an edge of the second external electrode facing the first external electrode.

The multilayer electronic component may further include first and second insulating portions spaced apart from each other between the first and second external electrodes on the mounting surface of the capacitor body.

The first and second insulating portions may respectively contact the first and second external electrodes and may respectively contact the first and second land portions, and a portion of the mounting surface of the capacitor body may be exposed between the first and second insulating portions.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

Figure 1:
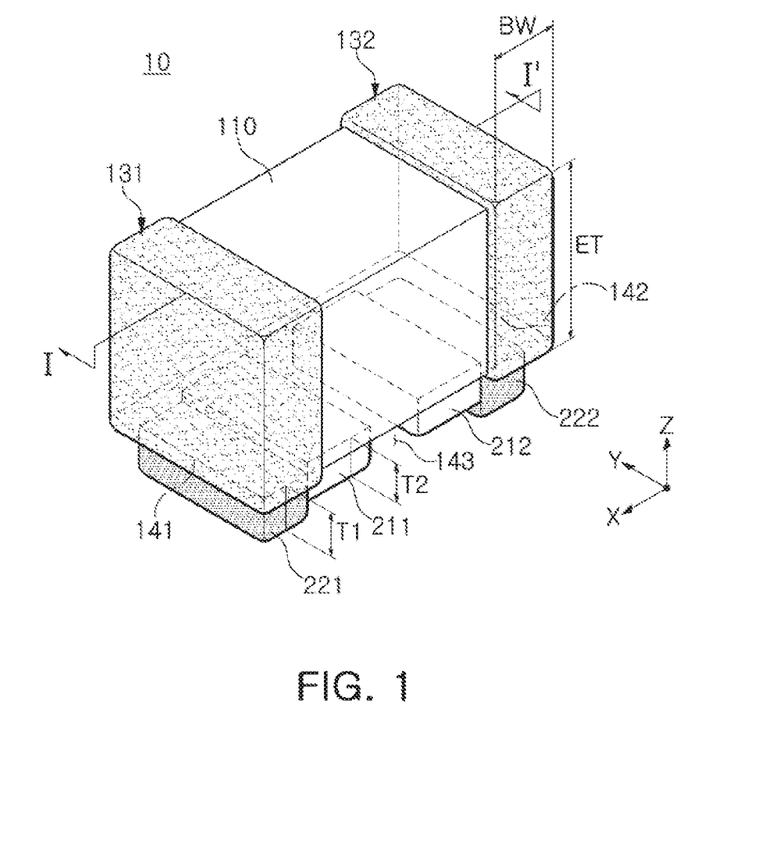
FIG. 1 is a perspective view illustrating a multilayer electronic component according to an exemplary embodiment.
Figure 2:
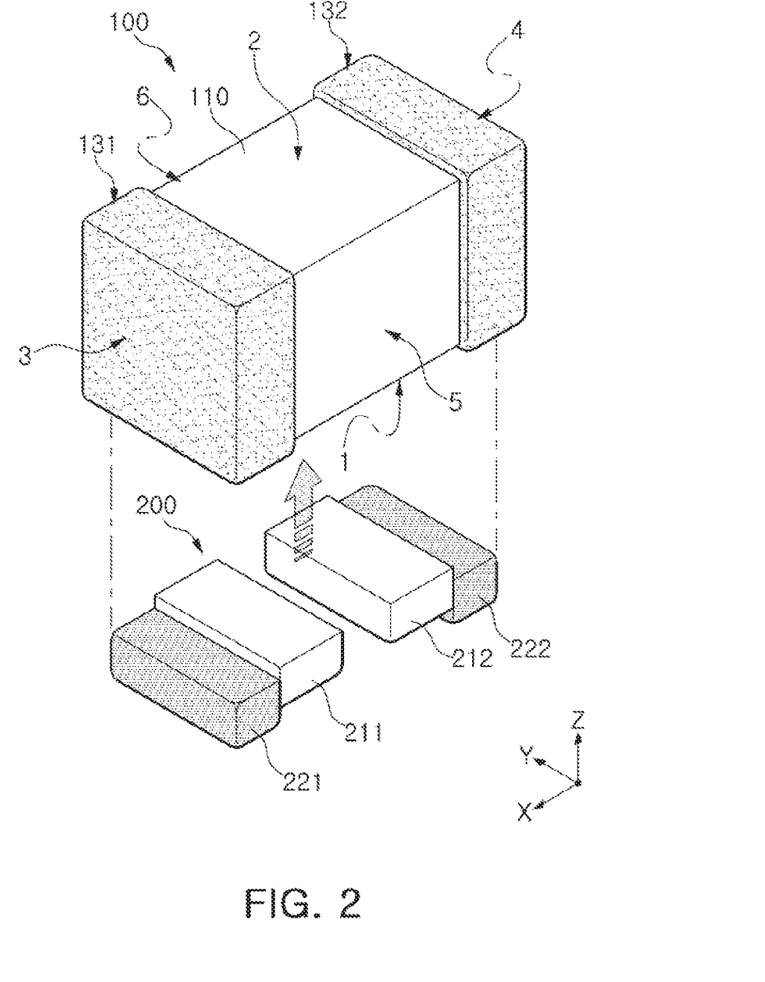
FIG. 2 is an exploded perspective view illustrating the multilayer electronic component of FIG. 1 from which land portions and insulating portions are separated.
Figure 3A:
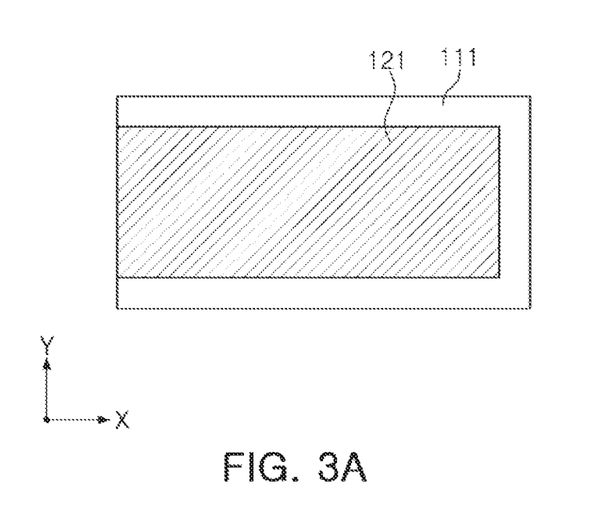
FIGS. 3A and 3B are plan views illustrating, respectively, first and second internal electrodes of the multilayer electronic component according to an exemplary embodiment.
Figure 3B:
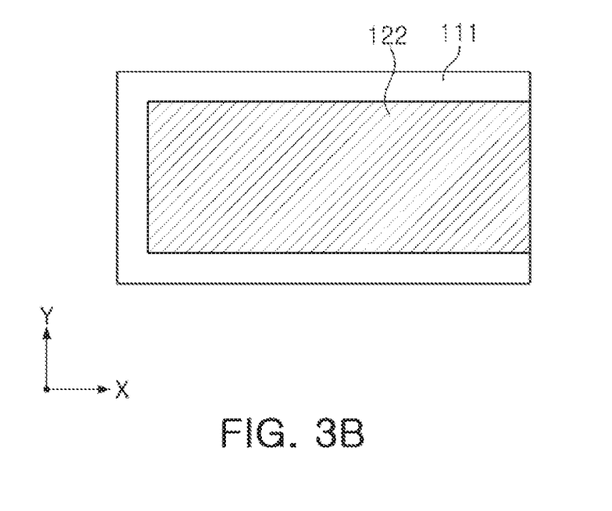
Figure 4:
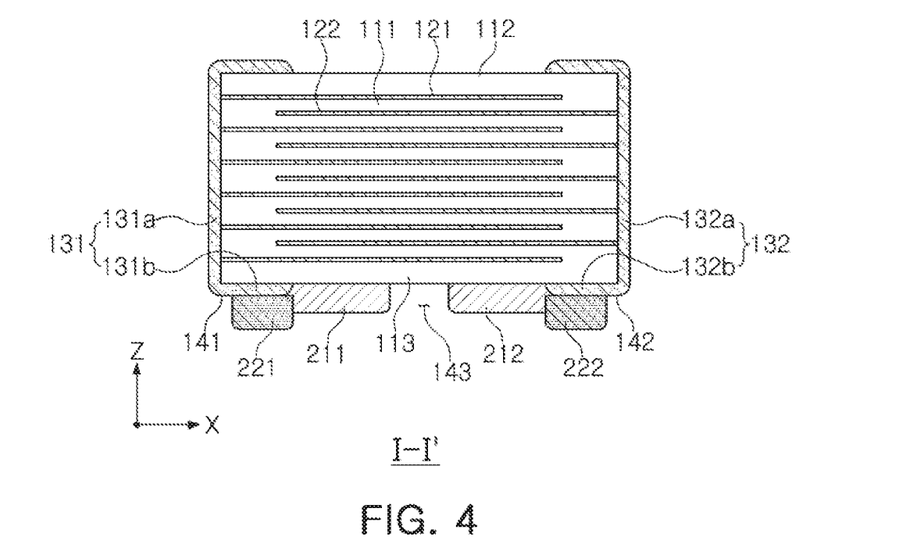
FIG. 4 is a cross-sectional view taken along line I-I' of FIG. 1.

FIG. 1 is a perspective view illustrating a multilayer electronic component according to an exemplary embodiment, FIG. 2 is an exploded perspective view illustrating the multilayer electronic component of FIG. 1 from which land portions and insulating portions are separated, FIGS. 3A and 3B are plan views illustrating, respectively, first and second internal electrodes of the multilayer electronic component according to an exemplary embodiment, and FIG. 4 is a cross-sectional view taken along line I-I' of FIG. 1.

Referring to FIGS. 1, 2, 3A, 3B, and 4, a multilayer electronic component 100 according to an exemplary embodiment may include a capacitor body 110, first and second external electrodes 131 and 132 disposed on a mounting surface of the capacitor body 110 to be spaced apart from each other, first and second land portions 221 and 222 formed of a conductive material and disposed on the first and second external electrodes 131 and 132, respectively, and first and second insulating portions 211 and 212 disposed between the first and second land portions 221 and 222 to be spaced apart from each other and each having one end thereof connected to a respective one of the first and second land portions 221 and 222.

Hereinafter, directions of the capacitor body 110 will be defined in order to clearly describe exemplary embodiments. X, Y, and Z in the drawings refer to a length direction, a width direction, and a thickness direction of the capacitor body 110, respectively. In addition, in the present exemplary embodiment, the thickness direction refers to a stacking direction in which dielectric layers are stacked.

The capacitor body 110 may be formed by stacking and then sintering a plurality of dielectric layers 111 in the Z direction, and may include the plurality of dielectric layers 111 and a plurality of first and second internal electrodes 121 and 122 alternately disposed in the Z direction with respective dielectric layers 111 interposed therebetween.

In addition, covers 112 and 113 having a predetermined thickness may be formed, respectively, on both sides of the capacitor body 110 in the Z direction.

Here, the respective adjacent dielectric layers 111 of the capacitor body 110 may be integrated with each other so that boundaries therebetween are not readily apparent.

The capacitor body 110 may have a substantially hexahedral shape. However, a shape of the capacitor body 110 is not limited thereto.

In the present exemplary embodiment, for convenience of explanation, first and second surfaces 1 and 2 of the capacitor body 110 refer to opposite surfaces of the capacitor body 110 opposing each other in the Z direction, third and fourth surfaces 3 and 4 of the capacitor body 110 refer to opposite surfaces of the capacitor body 110 connected to the first and second surfaces 1 and 2 and opposing each other in the X direction, and fifth and sixth surfaces 5 and 6 of the capacitor body 110 refer to opposite surfaces of the capacitor body 110 connected to the first and second surfaces 1 and 2, connected to the third and fourth surfaces 3 and 4, and opposing each other in the Y direction. In the present exemplary embodiment, the first surface 1 may be a mounting surface.

In addition, the dielectric layer 111 may include a ceramic material having a high dielectric constant, for example, a barium titanate ($BaTiO_3$) based ceramic powder, or the like. However, a material of the dielectric layer 111 is not limited thereto.

An example of the barium titanate ($BaTiO_3$) based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which Ca, Zr, or the like, is partially dissolved in $BaTiO_3$.

However, an example of the barium titanate ($BaTiO_3$) based ceramic powder is not limited thereto.

In addition, the dielectric layer 111 may further include a ceramic additive, an organic solvent, a plasticizer, a binder, a dispersant, and the like, in addition to the ceramic powder.

As the ceramic additive, for example, a transition metal oxide or a transition metal carbide, a rare earth element, magnesium (Mg), aluminum (Al), or the like, may be used.

The first and second internal electrodes 121 and 122, which are electrodes having different polarities, may be alternately disposed to face or overlap with each other in the Z direction with respective dielectric layers 111 interposed therebetween, and one end of each of the first and second internal electrodes 121 and 122 may be exposed through a respective one of the third and fourth surfaces 3 and 4 of the capacitor body 110.

Here, the first and second internal electrodes 121 and 122 may be electrically insulated from each other by the dielectric layer 111 disposed therebetween.

The end portions of the first internal electrodes 121 are exposed through the third surface 3, and the end portions of the second internal electrodes 122 are exposed through the fourth surface 4 of the capacitor body 110. The end portions of the first internal electrodes 121 may be electrically connected to portions of the first external electrode 131 disposed on the third surface 3, and the end portions of the second internal electrodes 122 may be electrically connected to portions of the second external electrode 132 disposed on the fourth surface 4 of the capacitor body 110 to be described below.

Here, the first and second internal electrodes 121 and 122 may be formed of a conductive metal, for example, a material such as nickel (Ni), a nickel (Ni) alloy, or the like. However, materials of the first and second internal electrodes 121 and 122 are not limited thereto.

According to the configuration as described above, when predetermined voltages are applied to the first and second external electrodes 131 and 132, electric charges may be accumulated between the first and second internal electrodes 121 and 122 facing and overlapping each other.

Here, a capacitance of the multilayer electronic component 100 may be proportional to an area of overlap between the first and second internal electrodes 121 and 122 in the Z direction.

In the present exemplary embodiment, external electrodes may include the first and second external electrodes 131 and 132.

The first and second external electrodes 131 and 132 may be disposed on and/or extend to the first surface 1 of the capacitor body 110, which is the mounting surface of the capacitor body 110, to be spaced apart from each other in the X direction. Voltages having different polarities may be provided to the first and second external electrodes 131 and 132, respectively, and the first and second external electrodes 131 and 132 may be electrically connected to the exposed portions of the first and second internal electrodes 121 and 122, respectively.

In addition, plating layers may optionally be formed on surfaces of the first and second external electrodes 131 and 132.

For example, the first and second external electrodes 131 and 132 may include conductive layers, nickel (Ni) plating layers formed on the conductive layers, and tin (Sn) plating layers formed on the nickel plating layers, respectively.

The plating layers may be formed by forming the first and second land portions and the first and second insulating portions on first and second band portions to be described below, respectively, and then performing plating.

The first external electrode 131 may include a first connected portion 131a and a first band portion 131b.

The first band portion 131b may be disposed on a portion of the first surface 1 of the capacitor body 110, and may be electrically connected to the first land portion 221.

The first connected portion 131a may be extended from the first band portion 131b to the third surface 3 of the capacitor body 110, and be connected to the first internal electrodes 121 exposed through the third surface 3 of the capacitor body 110.

Here, the first band portion 131b may be further formed on a portion of the second surface 2 of the capacitor body 110 and portions of the fifth and sixth surfaces 5 and 6 of the capacitor body 110 in order to improve adhesion strength, or the like.

The second external electrode 132 may include a second connected portion 132a and a second band portion 132b.

The second band portion 132b may be disposed on the first surface 1 of the capacitor body 110 to be spaced apart from the first band portion 131b in the X direction, and may be electrically connected to the second land portion 222.

The second connected portion 132a may be extended from the second band portion 132b to the fourth surface 4 of the capacitor body 110, and may be connected to the second internal electrodes 122 exposed through the fourth surface 4 of the capacitor body 110.

Here, the second band portion 132b may be further formed on a portion of the second surface 2 of the capacitor body 110 and portions of the fifth and sixth surfaces 5 and 6 of the capacitor body 110 in order to improve adhesion strength, or the like.

The first land portion 221 may be disposed beneath the first band portion 131b, and may be bonded to the first band portion 131b using a conductive paste such as a high temperature solder, copper (Cu) epoxy, or the like.

Here, a width and a length of the first land portion 221 may be smaller than those of the first band portion 131b. Therefore, a first solder accommodating portion 141 may be provided on the first band portion 131b by a step between the first band portion 131b and the first land portion 221. The first solder accommodating portion 141 may serve as a solder pocket at the time of mounting the multilayer electronic component on a circuit board. The first solder accommodating portion 141 may correspond to a portion of the first band portion 131b that is free of the first land portion 221 and that does not have the first land portion 221 disposed thereon.

The second land portion 222 may be disposed beneath the second band portion 132b, and may be bonded to the second band portion 132b using a conductive paste such as a high temperature solder, copper (Cu) epoxy, or the like.

Here, a width and a length of the second land portion 222 may be smaller than those of the second band portion 132b. Therefore, a second solder accommodating portion 142 may be provided on the second band portion 132b by a step between the second band portion 132b and the second land portion 222. The second solder accommodating portion 142 may serve as a solder pocket at the time of mounting the multilayer electronic component on the circuit board. The second solder accommodating portion 142 may correspond to a portion of the second band portion 132b that is free of the second land portion 222 and that does not have the second land portion 222 disposed thereon.

Here, the first and second land portions 221 and 222 may be formed by forming conductive patterns on a surface of the capacitor body formed of conductive ceramic such as alumina, or the like, using a conductive metal. Here, the conductive patterns may be formed by a method such as plating, or the like.

When the first and second land portions 221 and 222 are formed as described above, solder fillets may be formed on all of circumferential surfaces and lower surfaces of the first and second land portions 221 and 222 at the time of mounting the multilayer electronic component 100 on the circuit board and then performing soldering.

In a multilayer electronic component according to the related art in which an insulating substrate is attached to a lower portion of a multilayer capacitor, solder fillets are only formed on circumferential surfaces of the insulating substrate. On the other hand, in the present exemplary embodiment, the solder fillets may also be formed on the lower surfaces of the land portions to allow tension of solders to more uniformly act when the solders are melted in, for example, a reflow process. Therefore, a degree of misalignment in a position between the multilayer electronic component and the circuit board may be further suppressed as compared to the multilayer electronic component according to the related art having the insulating substrate.

In addition, the first and second land portions 221 and 222 may allow the capacitor body 110 to be spaced apart from the circuit board by a predetermined distance to thus suppress piezoelectric vibrations generated from the capacitor body 110 from being introduced into the circuit board.

The first and second insulating portions 211 and 212 may be disposed in the X direction between the first and second land portions 221 and 222 with a space portion 143 interposed therebetween, and the space portion 143 may have a predetermined interval.

The first insulating portion 211 may serve to guide the first land portion 221 to more easily dispose the first land portion 221 in an appropriate position at the time of attaching the first land portion 221 to the first band portion 131b.

The second insulating portion 212 may serve to guide the second land portion 222 to more easily dispose the second land portion 222 in an appropriate position at the time of attaching the second land portion 222 to the second band portion 132b.

The first and second insulating portions 211 and 212 may be attached to the first surface 1 of the capacitor body 110, and may serve to provide additional adhesion so that the first and second land portions 221 and 222 are not separated from the first and second band portions 131b and 132b, respectively.

For example, the first and second insulating portions 211 and 212 may be formed of epoxy or insulating ceramic. For example, the first and second insulating portions 211 and 212 may be formed of an insulating substrate or a circuit board such as FR4, a flexible printed circuit board (FPCB), or the like, but are not limited thereto.

Here, widths of the first and second insulating portions 211 and 212 may be smaller than that of the capacitor body 110.

Therefore, the first and second insulating portions 211 and 212 may absorb vibrations of the capacitor body 110 through elastic deformation of the first and second insulating portions 211 and 212 themselves to reduce acoustic noise.

In addition, the first and second insulating portions 211 and 212 may serve as partition walls partitioning the first surface 1 of the capacitor body 110 in the X direction.

Therefore, a phenomenon in which solder fillets are formed in the Z direction due to the introduction of melted solders, or the like, into portions stepped by the first and second insulating portions 211 and 212 at the time of mounting the multilayer electronic component 100 on the circuit board may be suppressed, and a transfer of a piezoelectric displacement amount of the multilayer electronic component 100 may be significantly reduced to further improve an acoustic noise reducing effect.

Meanwhile, as an entire weight of the multilayer electronic component is increased, an amount of vibrations transferred to the circuit board may be increased. For example, as weights of the insulating portions bonded to the capacitor body are increased, a piezoelectric vibration absorbing effect of the insulating portions may be reduced.

In the present exemplary embodiment, the space portion 143 or open region provided between the first and second insulating portions 211 and 212 may reduce the overall or entire weight of the multilayer electronic component, in spite of the weight being increased by bonding the first and second insulating portions 211 and 212 to the capacitor body to prevent the piezoelectric vibration absorbing effect through the elastic deformation of the first and second insulating portions 211 and 212 from being reduced.

Figure 5:
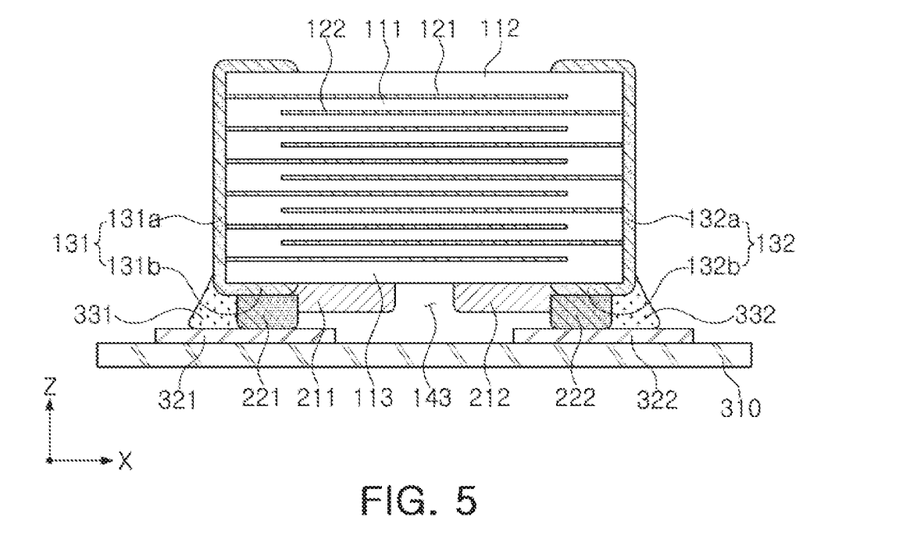
FIG. 5 is a schematic cross-sectional view illustratively showing the multilayer electronic component according to an exemplary embodiment mounted on a circuit board.

FIG. 5 is a schematic cross-sectional view illustratively showing the multilayer electronic component according to an exemplary embodiment mounted on a circuit board.

When voltages having different polarities are applied to the first and second external electrodes 131 and 132 formed on the multilayer electronic component 100 in a state in which the multilayer electronic component 100 is mounted on a circuit board 310, the capacitor body 110 may expand and contract in the Z direction due to an inverse piezoelectric effect of the dielectric layers 111, and both end portions of the first and second external electrodes 131 and 132 may contract and expand as opposed to the expansion and the contraction of the capacitor body 110 in the Z direction due to the Poisson effect.

Such a contraction and expansion may generate vibrations. In addition, the vibrations may be transferred from the first and second external electrodes 131 and 132 to the circuit board 310, and sound may thus be radiated from the circuit board 310, which becomes acoustic noise.

Generally, solders formed between the external electrodes of the multilayer electronic component and electrode pads formed on one surface of the circuit board are formed at a predetermined height toward a surface of the capacitor body opposing the mounting surface of the capacitor body, such that a large amount of vibrations generated from the multilayer electronic component may be transferred to the circuit board.

Referring to FIG. 5, a board having a multilayer electronic component according to the present exemplary embodiment may include the circuit board 310 having first and second electrode pads 321 and 322 disposed on one surface thereof and the multilayer electronic component 100 mounted on an upper surface of the circuit board 310 so that the first and second land portions 221 and 222 are connected to the first and second electrode pads 321 and 322, respectively.

Here, in the present exemplary embodiment, a case in which the multilayer electronic component 100 is mounted on the circuit board 210 by solders 331 and 332 is illustrated and described, but conductive pastes may be used instead of the solders in other examples.

In addition, according to the present exemplary embodiment, portions formed to be stepped on the first surface of the capacitor body 110 by the first and second land portions 221 and 222 may become the solder accommodating portions 141 and 142 to serve as solder pockets that may trap or contain the solders 331 and 332.

Therefore, the solders 331 and 332 may be effectively trapped or contained in the first and second solder accommodating portions 141 and 142, respectively, and formation of solder fillets toward the second surface of the capacitor body 110 may thus be suppressed.

Therefore, a piezoelectric vibration transfer path of the multilayer electronic component 100 may be blocked, and the solder fillets and a maximum displacement point in the capacitor body 110 may be spaced apart from each other to improve an acoustic noise reducing effect of the multilayer electronic component 100.

In addition, according to the present exemplary embodiment, a vibration amount of the piezoelectric vibrations of the multilayer electronic component transferred to the circuit board at an audio frequency within 20 kHz of the multilayer electronic component may be effectively suppressed by the acoustic noise reducing structure described above.

Therefore, high frequency vibrations of the multilayer electronic component may be reduced to prevent malfunctions of sensors that may be caused by high frequency vibrations in a high frequency region of 20 kHz or more of the multilayer electronic component in information technology (IT) or industry/electrical component fields and suppress accumulation of internal fatigue of the sensors due to vibrations for a long period of time.

As set forth above, according to the exemplary embodiments, acoustic noise in an audio frequency region less than 20 kHz and the high frequency vibrations in the high frequency region of 20 kHz or more of the multilayer electronic component may be reduced.

While exemplary embodiments have been shown and described above, it will be apparent to those skilled in the art that modifications and variations could be made without departing from the scope of the present invention as defined by the appended claims.

What is claimed is:

1. A multilayer electronic component comprising:
   a capacitor body;
   first and second external electrodes disposed and spaced apart from each other on a mounting surface of the capacitor body;
   first and second land portions including a conductive material and disposed on the first and second external electrodes, respectively; and
   first and second insulating portions disposed between the first and second land portions on the mounting surface of the capacitor body to be spaced apart from each other and each having one end connected to a respective one of the first and second land portions,
   wherein at least a portion of the first and second insulating portions respectively contacts the first and second land portions, and the widths of the first and second insulating portions are smaller than that of the capacitor body.

2. The multilayer electronic component of claim 1, wherein the capacitor body has a first surface corresponding to the mounting surface, a second surface opposing the first surface, and third and fourth surfaces connected to the first and second surfaces and opposing each other, and the capacitor body includes first and second internal electrodes each having one end exposed through a respective one of the third and fourth surfaces, and
   the first and second external electrodes include, respectively, first and second band portions disposed on the first surface to be spaced apart from each other and respectively connected to the first and second land portions, and first and second connected portions each extended from a respective one of the first and second band portions to a respective one of the third and fourth surfaces and respectively connected to the first and second internal electrodes.

3. The multilayer electronic component of claim 2, wherein widths and lengths of the first and second land portions are smaller than those of the first and second band portions, respectively.

4. The multilayer electronic component of claim 3, wherein first and second solder accommodating portions are provided on the first and second band portions, respectively, by steps between the first band and first land portions and between the second band and second land portions.

5. The multilayer electronic component of claim 2, wherein the capacitor body has fifth and sixth surfaces connected to the first and second surfaces, connected to the third and fourth surfaces, and opposing each other,
   the first external electrode extends to portions of the second, fifth, and sixth surfaces of the capacitor body, and
   the second external electrode extends to portions of the second, fifth, and sixth surfaces of the capacitor body.

6. The multilayer electronic component of claim 1, wherein the first and second land portions are conductive patterns disposed on a surface of the capacitor body formed of ceramic.

7. The multilayer electronic component of claim 1, wherein the first and second insulating portions are formed of epoxy or insulating ceramic.

8. A board having a multilayer electronic component, comprising:
   a circuit board having first and second electrode pads disposed on one surface thereof; and
   the multilayer electronic component of claim 1 mounted on the circuit board so that the first and second land portions are connected to the first and second electrode pads, respectively.

9. A multilayer electronic component comprising:
   a capacitor body;
   first and second external electrodes disposed on a mounting surface of the capacitor body; and
   first and second insulating portions spaced apart from each other between the first and second external electrodes on the mounting surface of the capacitor body,
   wherein the first and second insulating portions respectively contact the first and second external electrodes, and a portion of the mounting surface of the capacitor body is exposed between the first and second insulating portions.

10. The multilayer electronic component of claim 9, further comprising: first and second land portions formed of conductive material and respectively disposed on the first and second external electrodes, wherein the first and second land portions respectively contact the first and second insulating portions.

11. The multilayer electronic component of claim 9, wherein the first and second insulating portions have a greater thickness, measured orthogonally to the mounting surface of the capacitor body, than the first and second external electrodes, and the first and second land portions have a greater thickness, measured orthogonally to the mounting surface of the capacitor body, than the first and second insulating portions.

12. The multilayer electronic component of claim 10, wherein the first and second land portions are spaced apart from outer edges of the mounting surface of the capacitor body.

13. The multilayer electronic component of claim 9, wherein the first and second insulating portions are formed of epoxy or insulating ceramic.

14. A multilayer electronic component comprising:
a capacitor body;
first and second external electrodes disposed on a mounting surface of the capacitor body;
first and second insulating portions spaced apart from each other between the first and second external electrodes on the mounting surface of the capacitor body; and
first and second land portions formed of conductive material and respectively disposed on the first and second external electrodes,
wherein the first and second land portions are spaced apart from outer edges of the mounting surface of the capacitor body,
the first and second insulating portions respectively contact the first and second external electrodes and respectively contact the first and second land portions, and
a portion of the mounting surface of the capacitor body is exposed between the first and second insulating portions.

15. The multilayer electronic component of claim 14, wherein the first and second land portions have a greater thickness, measured orthogonally to the mounting surface of the capacitor body, than the first and second external electrodes.

16. The multilayer electronic component of claim 14, wherein the first and second external electrodes are spaced apart from each other on the mounting surface of the capacitor body, the first land portion is aligned with an edge of the first external electrode facing the second external electrode, and the second land portion is aligned with an edge of the second external electrode facing the first external electrode.

* * * * *